(12) United States Patent
Streuber et al.

(10) Patent No.: US 8,907,288 B2
(45) Date of Patent: Dec. 9, 2014

(54) DIGITALLY SCANNED MULTI-CELL ELECTRO-OPTIC SENSOR

(71) Applicant: Raytheon Company, Waltham, MA (US)

(72) Inventors: Casey T. Streuber, Tucson, AZ (US); Kent P. Pflibsen, Tucson, AZ (US); Michael P. Easton, Tucson, AZ (US)

(73) Assignee: Raytheon Company, Waltham, MA (US)

( * ) Notice: Subject to any disclaimer, the term of this patent is extended or adjusted under 35 U.S.C. 154(b) by 74 days.

(21) Appl. No.: 13/768,778

(22) Filed: Feb. 15, 2013

(65) Prior Publication Data

US 2014/0231650 A1    Aug. 21, 2014

(51) Int. Cl.
| | |
|---|---|
| *G01J 5/20* | (2006.01) |
| *H01L 27/146* | (2006.01) |
| *F41G 7/00* | (2006.01) |
| *F41G 7/22* | (2006.01) |
| *G01S 3/781* | (2006.01) |
| *G01S 3/784* | (2006.01) |
| *G02B 26/08* | (2006.01) |
| *H04N 5/335* | (2011.01) |

(52) U.S. Cl.
CPC .......... *H01L 27/14625* (2013.01); *F41G 7/008* (2013.01); *F41G 7/2253* (2013.01); *F41G 7/226* (2013.01); *F41G 7/2293* (2013.01); *G01S 3/781* (2013.01); *G01S 3/784* (2013.01); *G02B 26/0875* (2013.01); *H04N 5/335* (2013.01)
USPC ....................................................... 250/349

(58) Field of Classification Search
CPC ....................................................... G01J 5/20
USPC ....................................................... 250/349
See application file for complete search history.

(56) References Cited

U.S. PATENT DOCUMENTS

| | | | |
|---|---|---|---|
| 2009/0095912 A1 | 4/2009 | Slinger et al. | |
| 2011/0300490 A1* | 12/2011 | Rachet et al. | 430/322 |
| 2012/0038786 A1 | 2/2012 | Kelly et al. | |

OTHER PUBLICATIONS

Amit Ashok et al., "Compressive Light Field imaging," Proc of SPIE, vol. 7000, Apr. 8, 2010, pp. 1-12.
McManamon et al., "Optical Phased Array Technology." Proceedings of the IEEE, vol. 84, No. 2, Feb. 1996 pp. 268-298.
Duarte et al.,"Single-Pixel imaging via Compressive Sampling," IEEE Signal Processing Magazine [83] Mar. 2008.
Fan et al, "Switchable Fresnel lens using polymer-stabilized liquid crystals," Nov. 17, 2003, vol. 11; No. 23, Optics Express 3080.

* cited by examiner

*Primary Examiner* — David Porta
*Assistant Examiner* — Hugh H Maupin
(74) *Attorney, Agent, or Firm* — Eric A. Gifford

(57) ABSTRACT

A digitally scanned multi-cell EO sensor comprises a low-resolution multi-cell imaging detector. An array of optical focusing elements decomposes the sensor's FOV into at least four sub-fields. A sub-field directing array and focusing optic direct the optical radiation onto the imaging detector. In a first tilt mode, the optical radiation from the sub-fields is directed into at least four spatially separated sub-regions that each map to a different detector cell. A high-resolution spatial light modulator (SLM) digitally scans the FOV to select different portions of the FOV to map onto the different detector cells to time demultiplex spatially overlapping portions of the FOV onto each detector cell to stitch together a sub-image of a selected area of the FOV up to the native resolution of the SLM.

18 Claims, 10 Drawing Sheets

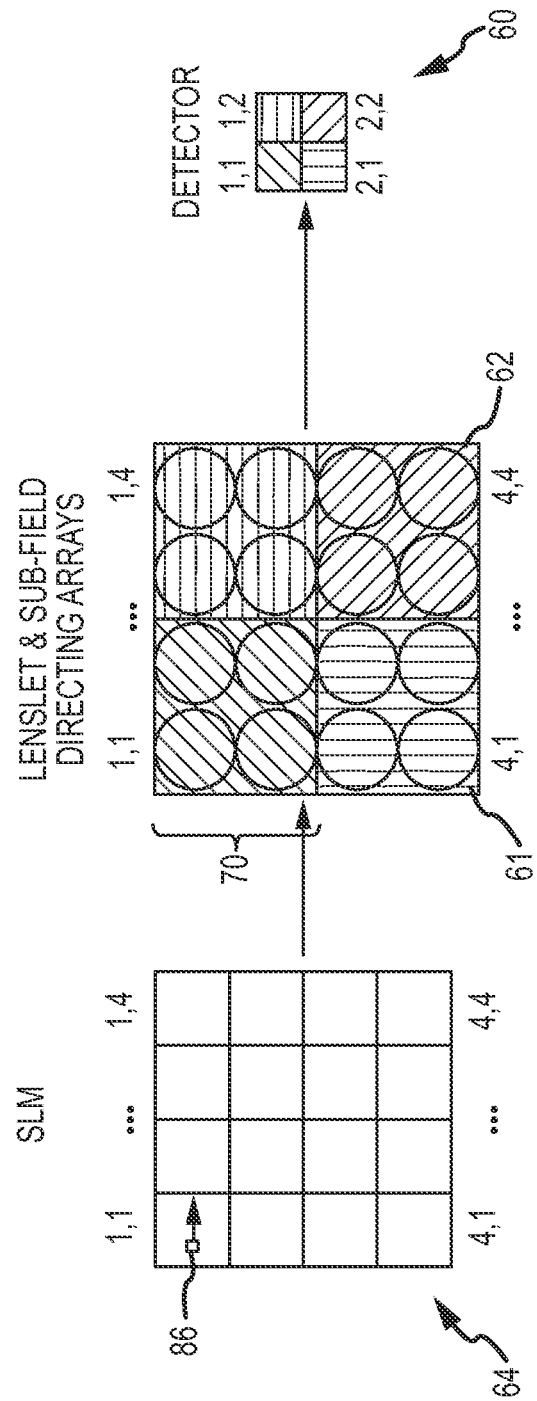

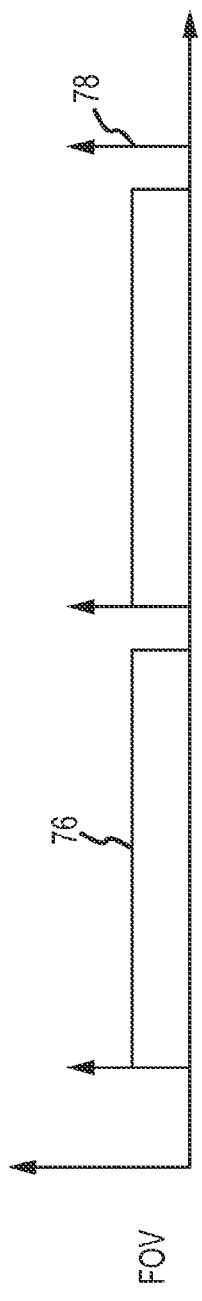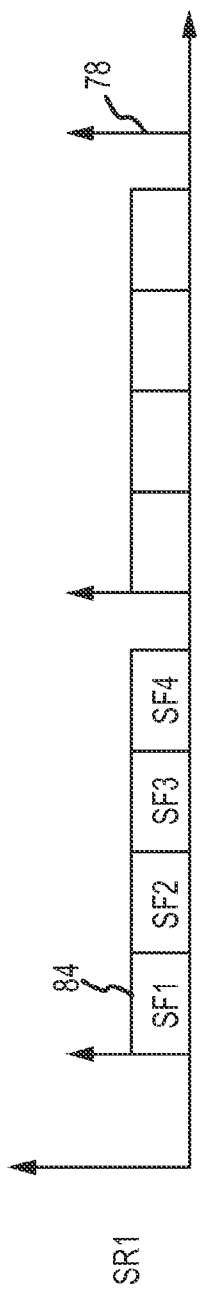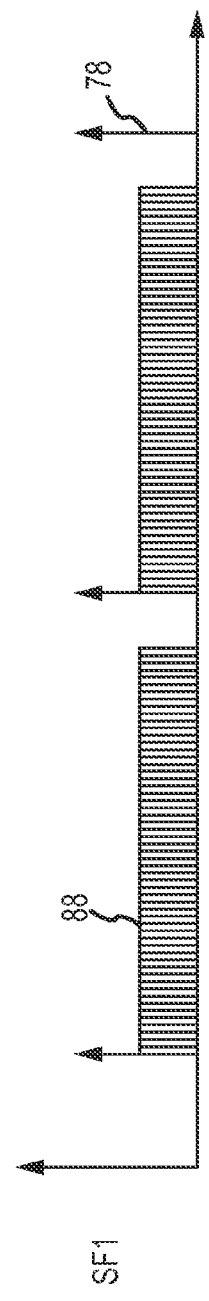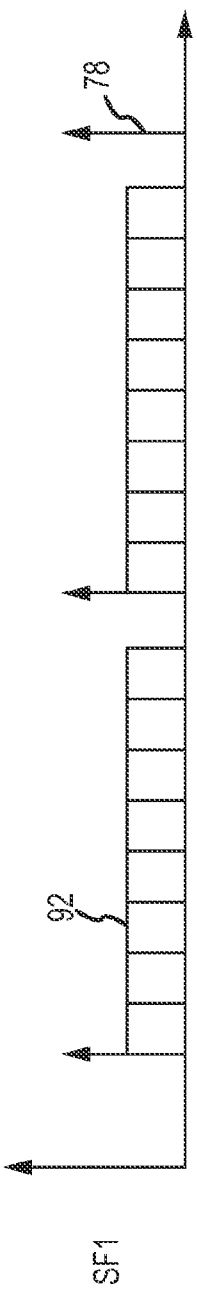

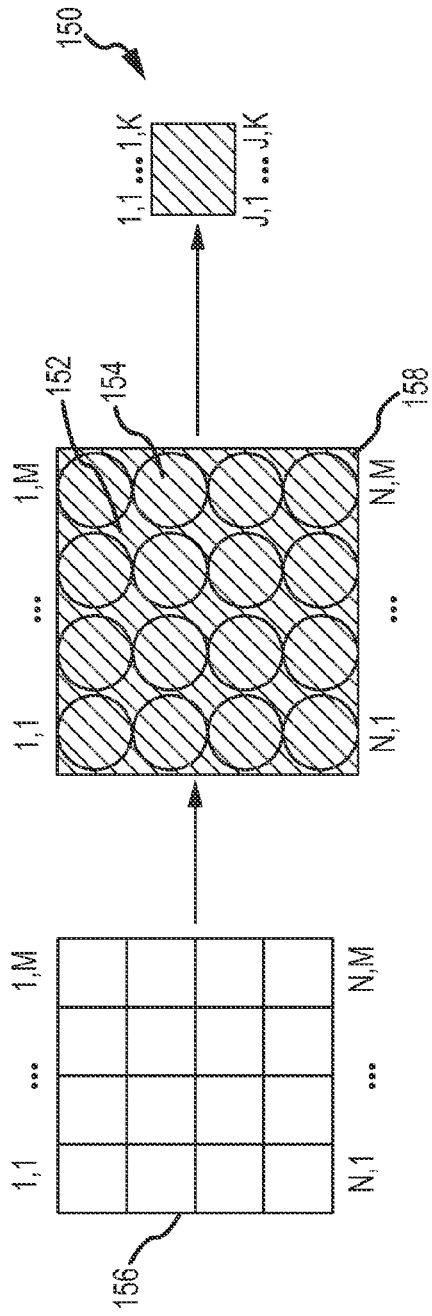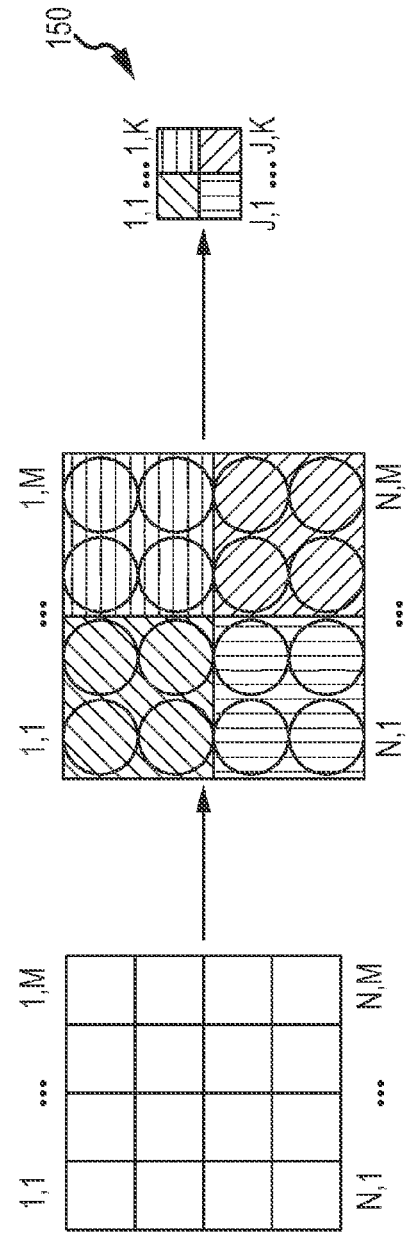

ated Feb. 13, 2012, the entire contents of which is incorporated by reference.

DIGITALLY SCANNED MULTI-CELL ELECTRO-OPTIC SENSOR

RELATED APPLICATION

This patent application is related to United States patent application entitled "Multi-Plenoptic System With Image Stacking and Method for Wide Field-of-Regard High Resolution Imaging", Ser. No. 13/371,984, filed Feb. 13, 2012, the entire contents of which is incorporated by reference.

BACKGROUND OF THE INVENTION

1. Field of the Invention

This invention relates to electro-optic (EO) sensors for image formation, and more particularly to a digitally scanned multi-cell EO sensor that provides capabilities similar to those of a dual-mode EO sensor.

2. Description of the Related Art

Many guided munitions (e.g. self-propelled missiles, rockets, gun-launched projectiles or aerial bombs) use a dual-mode EO sensor to guide the munition to its target. In a semi-active laser (SAL) mode, the sensor detects active guidance radiation in the form of laser radiation from a SAL designator that is reflected off of the target and locks onto the laser spot to provide line-of-sight (LOS) error estimates at an update rate required by the guidance system. In a passive imaging mode, the sensor detects IR radiation emitted from or reflected off of the target. The sources of IR energy are not artificial; they typically follow the laws of Planck radiation. The source may be the blackbody radiation emitted by the target directly or may, for example, be sunlight that is reflected off of the target. The passive imaging mode is typically used mid-flight or at the end of flight to process a more highly resolved image to determine whether or not the target is of interest or to choose a particular aimpoint on the target. The passive imaging mode operates at a much higher spatial resolution than the SAL mode. The passive imaging mode may be used to provide LOS error estimates to track the target when SAL designation is not available. However, due to its much higher spatial resolution, hence fewer incident photons per pixel, the passive imaging mode does not have the sensitivity to acquire and track the target at long ranges at the desired update rate.

A dual-mode EO sensor comprises a primary optical element having a common aperture for collecting and focusing SAL laser radiation and passive imaging radiation. A secondary optical element separates the SAL laser and passive imaging radiation by spectral band and directs the SAL laser radiation to a SAL detector and directs the passive imaging radiation to an IR imaging detector. The standard SAL laser designator produces laser radiation at 1.064 microns in the Near IR. The optics spatially encode an angle of incidence of the SAL laser radiation (e.g. a laser spot) at an entrance pupil onto the SAL detector. A quad-cell photodiode provides sufficient resolution to determine the LOS error estimate. The passive imaging radiation from a typical target is at long range, such that the electromagnetic wavefront at the sensor is considered to be composed of planar wavefronts. The structure of the target is imprinted on the composite wavefront as a summation of planar wavefronts with different slopes. The optics convert these slopes to spatial offsets in the image plane to form an image of the target on the pixelated IR imaging detector.

The IR imaging detector typically operates in the Short-Wave Infrared (SWIR) (1-2.5 um), Mid-Wave Infrared (MWIR) (3-5 um), or Long-Wave Infrared (LWIR) (8-14 um) electromagnetic radiation bands. With currently available technologies such as opto-mechanical scanning, staring focal plane array (FPA) or digital scanning (known as a "Rice pixel"), this detector may exhibit an effective spatial resolution, for example, of anywhere from 32×32 to 4,000×3,000 pixels. Selection of the desired band(s) for the passive imaging sensor depends on the target of interest and the expected atmospheric absorption bands. The SWIR Band is typically used in night conditions to provide high contrast. The MWIR band is selected if the expected targets are relatively hot (e.g. planes, missiles, etc.). The LWIR band is typically used to image targets that have operating temperatures slightly above the standard 300K background.

To provide the desired spatial resolutions for the IR imaging detectors, early systems utilized an opto-mechanical scanning architecture. These systems could scan a limited FOV across a larger field of regard (FOR) and stitch together an image that had the desired resolution. In some systems, a spinning mass gyro platform effectively scanned a single pixel or line of pixels across a wide FOR. The optical telescope itself is spun and precesses to map out a large scan area. These systems can achieve an extremely narrow point spread function. In a situation with a static scene and no constraints on frame rate across the FOR opto-mechanical is still the optimum system design as far as optical performance is concerned. However, in a dynamic scene that requires feedback at a particular update rate these systems are less than ideal. If a target is moving quickly through a scene, the act of scanning through that scene could cause the system to miss the target entirely.

As manufacturing techniques progressed and more and more pixels could be processed on a detector, the need to utilize opto-mechanical scanning prisms or spinning mass systems diminished. The system performance gains of being able to "see" a larger FOV instantaneously outweighed cost and optical performance constraints. These systems, typically referred to as staring focal plane arrays (FPAs), are the current standard in the electro-optic sensor industry. Staring FPAs provide the requisite resolution and FOV required. The staring FPA enables interrogation of different areas of the FOV concurrently at the native resolution of the FPA at high update rates. If a larger FOR is demanded for a particular application, a gimbal platform is typically used to move the FOV in a step-stare fashion across the FOR. This approach strikes a balance of cost between the detector and the opto-mechanical platform.

More recently there has been some desire to utilized wide FOV optics and larger detector formats and or smaller detector pixels to achieve a fixed post electro-optic sensor that is stabilized electronically and meets a large range of FOR requirements. However, unlike the digital camera industry that utilizes Silicon detector technology in the visible band, the push to larger and larger format detector arrays in the SWIR, MWIR and LWIR bands have not been followed by a reduction in cost of the detector for infrared systems. As users demand more resolution across a wider FOV the detector cost, and cost to cool the detector, have become the most expensive component in the electro-optic sensor system.

In an attempt to address this problem a group of researchers at Rice University developed in effect a single pixel digital scanning system known as the "Rice pixel" [Duane et al., *Single-Pixel Imaging via Compressive Sampling*, IEEE Signal Processing Magazine, March 2008 (83-91)]. They developed a light modulation technique that orthogonally coded the signals present on a large field of view MEMs based SLM. In this way they could mathematically reconstruct the entire scene via the frame sequence of a single pixel. The SLM was a commercial digital micro-mirror device (DMD) developed by Texas Instruments, Inc. for projection systems and thus was at much reduced cost to the typical analog opto-mechanical scanning systems. However, as the users of current electro-optic sensors have become accustomed to the performance provided by a staring FPA, those users have hesitated to move back to a single pixel architecture that demands significant processor resources, cannot maintain the high update rates and cannot concurrently interrogate different areas of the FOV.

The opto-mechanical scanning, staring FPA and digitally scanned Rice pixel are also deployed in single-mode passive IR imaging EO sensors in which SAL designation is not available. The opto-mechanical scanning and staring FPA single-mode systems must either accept a shorter acquisition range or provide large and expensive optical systems to increase sensitivity. The Rice pixel cannot instantly interrogate the entire FOV and has limited performance in dynamic scenes.

SUMMARY OF THE INVENTION

The following is a summary of the invention in order to provide a basic understanding of some aspects of the invention. This summary is not intended to identify key or critical elements of the invention or to delineate the scope of the invention. Its sole purpose is to present some concepts of the invention in a simplified form as a prelude to the more detailed description and the defining claims that are presented later.

The present invention provides a digitally scanned multi-cell EO sensor that provides capabilities similar to those of a dual-mode EO sensor. The EO sensor may be configured to provide either a low-resolution sensor with high sensitivity or a high-resolution sensor. The EO sensor may be configured to interrogate different areas of the FOV with different resolutions concurrently.

In an embodiment, a digitally scanned multi-cell EO sensor comprises an objective optical system that forms an image within a field of view (FOV) and a high-resolution spatial light modulator (SLM) having an array of addressable elements to independently and selectively attenuate (i.e. substantially pass or substantially block) optical radiation within different portions of the FOV. An optical focusing array comprising at least four optical focusing elements decomposes the FOV into at least four sub-fields. Each sub-field is mapped to a plurality of SLM addressable elements. A sub-field directing array tilts the selected optical radiation in each sub-field by a tilt angle and a focusing optic focuses the optical radiation onto a common image plane. In a first tilt mode, the sub-field directing array is configured to provide at least four different tilt angles across the FOV so that the focusing optic directs the tilted optical radiation to form at least four spatially separated sub-regions at the common image plane. One or more sub-fields are mapped to each sub-region. A multi-cell imaging detector is positioned at or near the common image plane with the full spatial extent of the detector mapped to the combined spatial extents of the sub-regions. Each detector cell includes at least one pixel element that converts incident optical radiation into an electrical signal. In the first tilt mode each sub-region is mapped to a different detector cell.

In an embodiment, the imaging detector is responsive to IR optical radiation in one of the SWIR, MIR and LWIR bands. In other embodiments, the imaging detector may be responsive to ultra-violet, visible or NIR band optical radiation.

In different embodiments, the digitally scanned multi-cell EO sensor may be used in a single-mode architecture or may provide the IR imaging detector in a dual-mode EO sensor that also uses a SAL detector.

In an embodiment, the EO sensor further comprises a field correcting optical array that insures that the entrance pupil of the objective optics is imaged onto the array of optical focusing elements so that the individual optical focusing elements are able to capture as much of the incident optical radiation as possible.

In an embodiment, the sub-field directing array and focusing optic direct the selected optical radiation from the sub-fields into four sub-regions that are mapped onto the different cells of a quad-cell photodiode. In different embodiments, each detector cell may comprise a single pixel element or a plurality of pixel elements. In an embodiment, the optical focusing array comprises four optical focusing elements that map four sub-fields to the quad-cell photodiode. In an embodiment, the optical focusing array comprises greater than four optical focusing elements whereby the sub-field directing array substantially overlaps more than one sub-field on each cell of the quad-cell photodiode.

In an embodiment, the tilt angles provided by the sub-field directing array are fixed and the first tilt mode is the only tilt mode.

In an embodiment, the sub-field directing array is reconfigurable to provide different tilt angles for at least a second tilt mode. The optical focusing array provides a variable magnification so that the combined sub-regions are mapped to the full extent of the imaging detector for at least the first and second tilt modes. In an embodiment, in the second tilt mode the sub-field directing array and optical focusing array are configured to substantially overlap each sub-field on the full extent of the imaging detector.

In an embodiment, the EO sensor further comprises a processor that provides control signals to the SLM to control the addressable elements to time demultiplex portions of the FOV that are spatially overlapped on the imaging detector and to the imaging detector to read out the electrical signals over an integration period to stitch together one or more images at varying resolution. The processor may control the SLM to concurrently interrogate different areas of the FOV that are mapped to different detector cells to stitch together sub-images with different resolutions. The processor may calculate a signal-to-noise ratio (SNR) of the object in the image(s) to set a minimum integration period to maintain at least a minimum SNR. The minimum integration period bounds the time demultiplexing and the resolution of the image(s). As the distance between the EO sensor and object closes, the signal strength increases and the minimum integration period required to maintain the minimum SNR is reduced allowing for greater time demultiplexing to stitch together higher resolution images.

In an embodiment in which multiple sub-fields are overlapped on each detector cell, the processor generates control signals to execute an acquisition mode in which the SLM passes all of the optical radiation in the FOV to form an image on the multi-cell imaging detector and processes the image to detect the object and generate LOS error estimates to locate the object in a sub-region of the FOV. The processor then generates control signals to execute a first discrimination mode in which the SLM time demultiplexes the multiple sub-fields in that sub-region to read out a time sequence of sub-images from the corresponding detector cell and locate the object in a particular sub-field. The processor then generates control signals to execute a second discrimination mode in which the SLM time demultiplexes the portions of the image in the particular sub-field that map to individual addressable elements to build an image of that sub-field at the native resolution of the SLM. This may be done using orthogonal coding of the SLM. The processor may execute the first and second discrimination modes concurrently on different sub-regions to search for or track different objects in the FOV. In an embodiment in which each sub-field is mapped to a different detector cell the first discrimination mode is not applicable.

These and other features and advantages of the invention will be apparent to those skilled in the art from the following detailed description of preferred embodiments, taken together with the accompanying drawings, in which:

BRIEF DESCRIPTION OF THE DRAWINGS

FIGS. 2a-2d are diagrams illustrating the variable resolution capability of the EO sensor;

FIGS. 3a-3d are diagrams illustrating the scanning and integration periods for the different resolution modes in FIGS. 2a-2d;

FIGS. 5a-5c are diagrams illustrating different modes of the EO sensor in FIG. 4.

DETAILED DESCRIPTION OF THE INVENTION

Figure 1A:
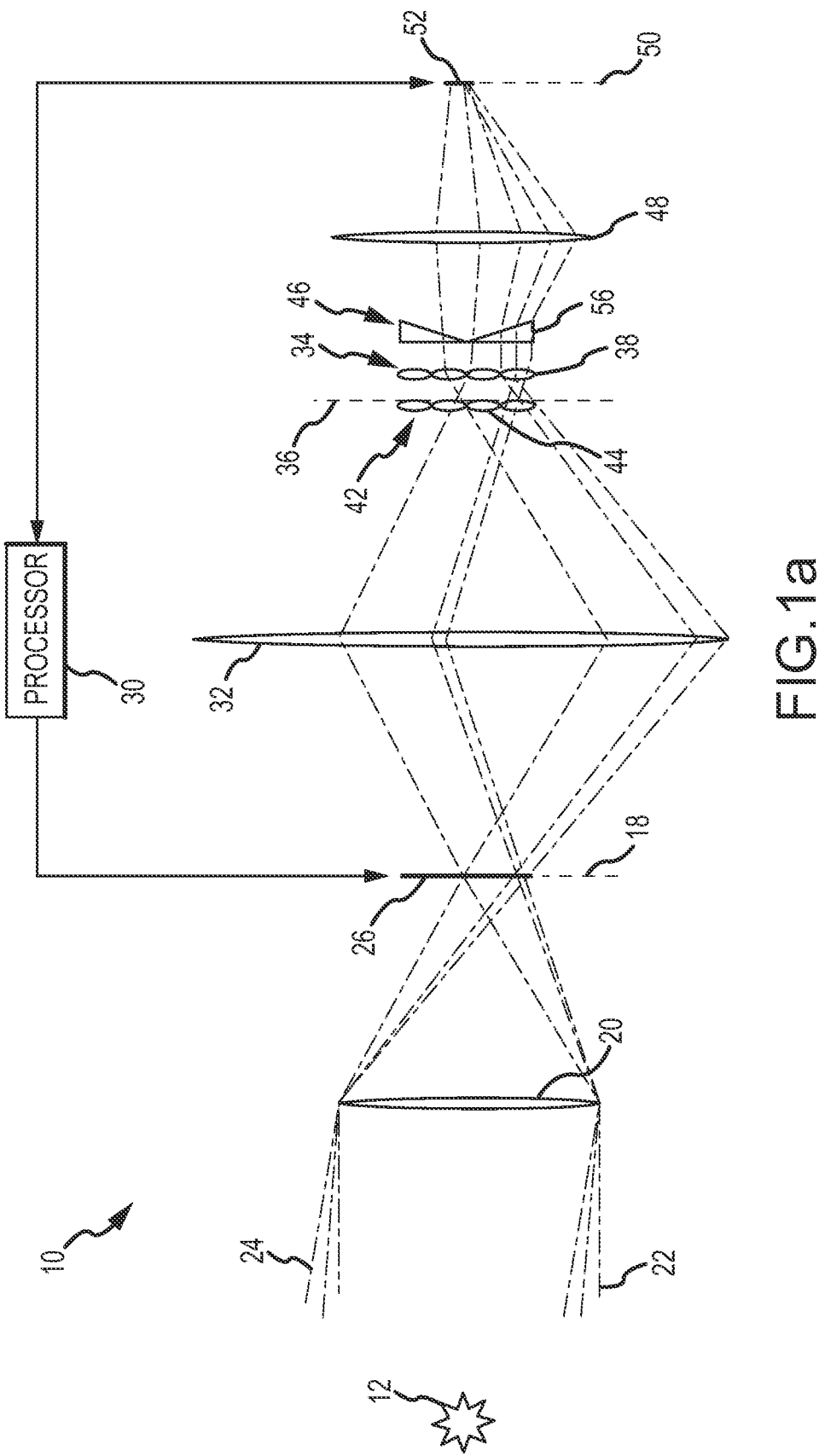
FIGS. 1a and 1b are diagrams of an embodiment of a digitally scanned multi-cell EO sensor.

The present invention provides a digitally scanned multi-cell EO sensor that provides capabilities similar to those of a dual-mode EO sensor with a single low-resolution imaging detector. The digitally scanned multi-cell EO sensor can be used in many applications including but not limited to guided munitions (e.g. self-propelled missiles, rockets, kinetic weapons, gun-launched projectiles or aerial bombs), satellites, space-launched kill vehicles, unmanned aerial vehicles (UAVs) and surveillance systems. Other potential uses include for guidance systems for autonomous cars or aircraft or ships and specific uses such as automated aerial refueling, ship docking or aircraft landing systems. The digitally scanned multi-cell EO sensor can be used in any system in which the EO sensor needs to provide (a) high detection sensitivity at long ranges to the object accepting low image resolution and (b) high resolution at short ranges to the object. The digitally scanned multi-cell EO sensor may be used in a single-mode architecture or as the IR detector in a dual-mode architecture with a conventional SAL detector.

The digitally scanned multi-cell EO sensor comprises a low-resolution multi-cell imaging detector (one or more pixels per cell). An array of optical focusing elements decomposes the sensor's FOV into at least four sub-fields. A sub-field directing array and focusing optic direct the optical radiation onto the imaging detector. In a first tilt mode, the optical radiation from the sub-fields is directed into at least four spatially separated sub-regions that each map to a different detector cell. Typically, the optical radiation from multiple sub-fields will be mapped to a sub-region and substantially overlapped on a given detector cell. A high-resolution spatial light modulator (SLM) digitally scans the FOV to select different portions of the FOV to map onto the different detector cells to time demultiplex spatially overlapping portions of the FOV onto each detector cell, stitching together a sub-image of a selected area of the FOV at a specified resolution (up to the native resolution of the SLM). As object signal strength increases with proximity to the sensor, the integration time required for each scan to maintain a minimum SNR is reduced. Consequently, the resolution may be increased while maintaining the SNR at the guidance update rate.

For purposes of illustration, an embodiment of a digitally scanned multi-cell EO sensor comprises a quad-cell photo-detector having one pixel per cell, a 4×4 lenslet array that decomposes the FOV into 16 sub-fields, a sub-field directing array that overlaps four different sub-fields onto each detector cell and a 1,000×1,000 element SLM. Each sub-field maps to a different 250×250 block of SLM addressable elements. Each detector pixel maps to four 250×250 blocks of addressable elements. The EO sensor may be configured via the SLM to detect a 2×2 image of the entire FOV for maximum sensitivity or to detect images of specific areas of the FOV up to the native resolution of the SLM. The digitally scanned multi-cell EO sensor has the ability to concurrently interrogate different areas of the FOV at task appropriate resolutions. For example, the EO sensor could concurrently scan a specific area of a particular sub-field at the native resolution of the SLM onto a detector cell to provide maximum discrimination power while passing all of the optical radiation mapped to the other three detector cells to search for other objects with maximum sensitivity.

Figure 1B:
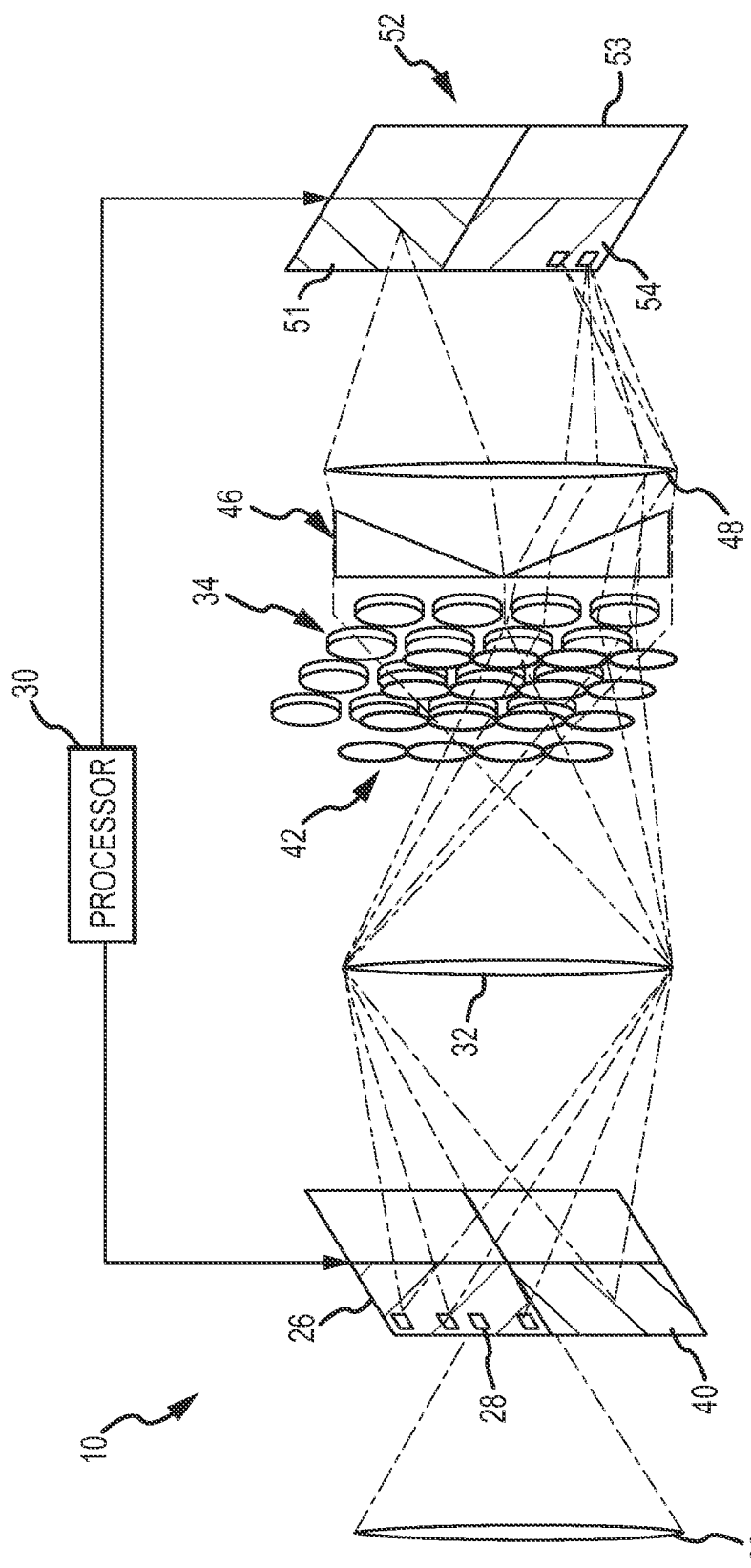

Referring now to the drawings, an embodiment of a digitally scanned multi-cell EO sensor 10 for acquiring, tracking and discriminating an object 12 denoted by a "star" within a sensor FOV is shown in FIGS. 1a and 1b. While object 12 is shown close to the entrance pupil of the EO sensor notionally, the object is typically at a very large distance from the entrance pupil of the EO sensor at least initially. Over this large distance the object radiation can be described as a collection of optical rays with varying angles that depend on the type of emission/scatter from the object. However, again given the large distance, only a small selection of those rays that are grouped around an angle defined by the geometry of the object and the EO sensor enter the entrance pupil of the EO sensor. This angle is then transformed into a spatial offset to form an image at an image plane 18 via the objective optics 20. In this embodiment, the entrance pupil is defined by the objective optics. This transformation is due to the fundamental physics of imaging, which to first order follow an equation that states that the spatial offset at the focal plane of an optic is equal to the focal length of the optic multiplied by the tangent of the angle of incidence to the optic. The rays 22 denote an object on the same optical axis as the EO sensor and the rays 24 denote an object that is offset in angle, defining the maximum half field-of-view (FOV) of the system.

A spatial light modulator (SLM) 26 is positioned at or near image plane 18. SLM 26 comprises an array of addressable elements 28 to independently and selectively attenuate (i.e. substantially pass or substantially block) optical radiation (e.g. visible, NIR, SWIR, MWIR, LWIR) within different portions of the FOV. For simplicity SLM 26 is depicted as a transmissive device such as an addressable liquid crystal. Alternately, SLM 26 may be a digital micro-mirror device such as produced by Texas Instruments, Inc. A processor(s) 30 provides control signals to addressable elements 28 to selectively attenuate (i.e. substantially pass or substantially block) optical radiation within different portions of the FOV. The SLM allows selection of individual fields of view up to the limit of the SLM's native resolution. Because the SLM is electronically controlled, the areas(s) that will be projected through the rest of the optical system can be changed nearly instantaneously. This allows the processor to effectively electronically scan through the FOV. SLM technologies are very mature and the cost per addressable element is much lower than the cost per pixel for high-resolution IR imaging detectors.

Relay optics 32 convert the spatial mapping at image plane 18 to another spatial mapping at another image plane that can be accessed by an optical focusing array 34. The optical focusing array 34 is positioned with its focal plane 36 at or near the reimaged plane. The relay optics 32 may or may not provide magnification.

Optical focusing array 34 (such as a lenslet array) comprises at least four optical focusing elements 38 (e.g. lenslets) that decompose the FOV into at least four sub-fields 40, one sub-field per focusing element. Each sub-field is addressed by a plurality of SLM addressable elements 28. Each addressable element is mapped to a different portion of the FOV.

The individual optical focusing elements 38 reduce the angular spread of rays that are incident to the objective optics 20. The focusing elements split the entire FOV into a number of smaller sub-fields 40, acting to "collimate" the ray bundles over a limited range of spatial offsets defined by the focal length and size of the individual focusing elements. In effect, each optical focusing element 38 converts the sub-field spatial mappings at the relayed image plane to an angular mapping.

In order to insure that the individual focusing elements 38 collect as much of the optical radiation as possible, a field correcting optical array 42 is placed close to first image plane 18 or the optically relayed version of this plane to introduce a negligible optical power to the system. The focal length of the individual focusing elements 44 of field correcting optical array 42 should be close to that of the individual optical focusing elements 38 to insure that the entrance pupil of the objective imaging system is imaged onto the array of optical focusing elements 38. This pupil mapping insures that the individual optical focusing elements are able to capture as much of the incident electromagnetic radiation as possible. It should be obvious to a person with basic knowledge in optical design that the two separate functions of the optical focusing array 34 and field correcting optical array 42 might be combined in various forms, but that the basic output of the combined system would be a reduced angular spread of the rays that are incident to the objective optics with a telecentric configuration such that each sub-field would contain a displaced, but identical spread of rays.

A sub-field directing array 46 in the substantially collimated space of the optical focusing array 34 adjusts the angular mapping of each sub-field 40 by tilting the selected optical radiation by a tilt angle. The sub-field directing array 46 may be configured so that the tilt angle is the same or approximately same (e.g. zero tilt) for all of the sub-fields (this mode only being available in an "adaptive" system as described below), is the same for groups of multiple sub-fields but differs between groups or is different for each of the sub-fields.

A focusing optic 48 in the substantially collimated space of the sub-field directing array 46 focuses the selected (i.e. substantially non-blocked) optical radiation to convert the angular mappings to spatial mappings at a common image plane 50. The tilt angles may be controlled so that the focusing optic substantially overlaps all of the sub-fields in a single sub-region. In ideal conditions, if the tilt angles are all the same the sub-fields will be aligned on the single sub-region. In a real optical system, the tilt angles may vary slightly to better overlap the sub-fields. If the tilt angle varies between groups of sub-fields, the focusing optic directs each group to a different sub-region and substantially overlaps the multiple sub-fields within each group in the associated sub-region. If the tilt angle is different for each sub-field, the focusing optic directs each sub-field to a different sub-region 51.

A multi-cell imaging detector 52 is positioned at or near the common image plane 50. The magnification of the optical system is set such that the spatial extent of the combined sub-regions 51 maps to the full extent of imaging detector 52. Each detector cell 53 comprises at least one pixel element 54 that converts incident optical radiation into an electrical signal that is read out at an integration period determined by processor(s) 30. Each pixel element 54 is mapped to a plurality of SLM addressable elements 38. The electrical signal is converted to a digital signal that is provided to processor(s) 30 to form one or more images.

Each detector "cell" 53 may be a physically/electrically separate detector such as each one-pixel cell in a quad-cell photodiode or may be an electronically defined sub-region of a single multi-pixel imaging detector. Imaging detector 52 is typically formed of materials responsive in one of the LWIR, MIR or SWIR spectral bands. Alternately, the imaging detector could be formed of a material in the visible or NIR band. The total number of imaging pixels should be low, much lower than the resolution of the SLM. The physical number of detector pixels is kept low not only to reduce cost but also to achieve high sensitivity by spatially overlapping portions of the FOV onto each detector pixel. High resolution is achieved by digitally scanning the SLM to time demultiplex these spatially overlapping portions. The imaging detector has a much smaller footprint than the SLM. For example, the imaging detector may be one-fifth the size of the SLM. In general, the imaging detector is no more than one-half the size of the SLM and one-half the resolution of the SLM.

Again one skilled in the art will realize that the functions of the field correcting optical array 42, optical focusing array 34, and sub-field directing optical array 46 might be combined in various forms either for ease of build or economic concerns. However, it is important to be clear that there are three distinct optical functions required:

(1) Provide maximum transmission of the incident optical radiation through the system (field correcting optical array 42), (2) Reduce the angular spread of the signals that are imaged through the objective optics (optical focusing array 34), and (3) Control the placement of each sub-field onto the detector (sub-field directing optical array 46).

Figure 4:
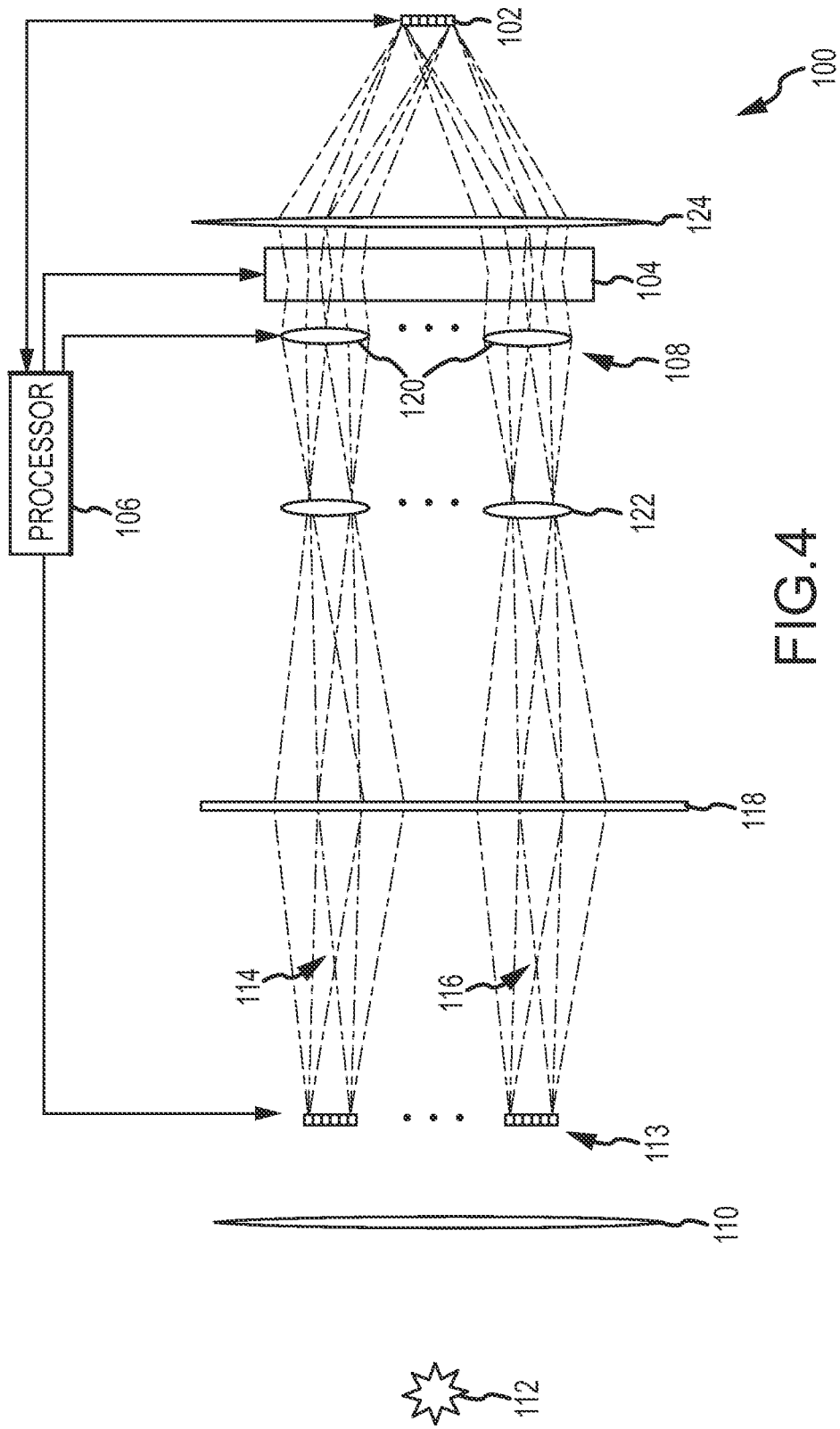
FIG. 4 is another embodiment of an electro-optic sensor comprising an adaptive sub-field directing array.

Sub-field directing array 46 may be implemented with fixed components such as optical wedges 56 as shown in FIGS. 1a and 1b to provide fixed tilt angles or with adaptive components such as an adaptive optical phased array as shown in FIG. 4 to provide tilt angles that can be changed to reconfigure the optical system. In either case, in a first tilt mode the sub-field directing array 46 is configured to provide at least four different tilt angles so that the focusing optic 48 directs the tilted optical radiation to form at least four spatially separated sub-regions 51 at the common image plane that are each mapped to a different detector cell 53. A fixed configuration has only the one first tilt mode. An adaptive configuration will have at least a second and possibly more modes. For example, in a second tilt mode an adaptive sub-field directing array may be configured to provide zero tilt angle across the entire FOV in which case all of the sub-fields are substantially overlapped on a single sub-region that is mapped to the full extent of the imaging detector.

It should be noted than any version between the two extreme states can be accomplished by providing the requisite optical tilt to overlap regions of the sub-field. This might be advantageous for a variety of system applications, where increased resolution is required, but full overlap of the fields might prevent simultaneous discrimination of multiple targets. In addition there are subtle but significant reasons to induce partial overlaps of the sub-field components (e.g. reducing/eliminating the impact of dead zones that naturally occur at the boundary of the individual optical focusing elements). Finally it is also possible to vary the amount of sub-field overlap across the full field of view. In many cases the center of the field of view is used primarily in the terminal mode of operation where object signal is plentiful and high resolution is required to estimate a terminal aim-point. Alternatively, in acquisition mode signal strength is low and the object could appear anywhere within the field of view of the system. The degree of imaging resolution in this phase is not typically important. To those skilled in the art it is clear that a system trade might be made to optimize performance by varying the amount of sub-field overlap.

To operate EO sensor 10, processor(s) 30 provide control signals to the SLM 26 to switch the addressable elements 28 to time demultiplex portions of the FOV that are spatially overlapped on the imaging detector 52 and provide control signals to the imaging detector 52 to read out the electrical signals over an integration period to stitch together one or more images at varying resolution. The processor 30 may control the SLM to concurrently interrogate different areas of the FOV that are mapped to different detector cells to stitch together sub-images with different resolutions. The processor may calculate a SNR of the object in the image(s) to set a minimum integration period to maintain at least a minimum SNR. The minimum integration period bounds the time demultiplexing and the resolution of the image(s). As the distance between the EO sensor 10 and object 12 closes, the signal strength increases and the minimum integration period required to maintain the minimum SNR is reduced allowing for greater time demultiplexing to stitch together higher resolution images.

For purposes of illustration and with reference to FIGS. 2a-2d and 3a-3d consider the following example of a quad-cell photodetector 60 having one pixel per cell, a 4×4 lenslet array 61 and 2×2 sub-field directing array 62 that overlap four different sub-fields onto each detector cell and a 1,000×1,000 element SLM 64. Each lenslet 66 and sub-field 68 map to a different 250×250 block of SLM addressable elements 72. Four lenslets 66 and four sub-fields 68 map to each sub-region 70. Each detector pixel 74 maps to 4 250×250 blocks of addressable elements 72.

Figure 2A:
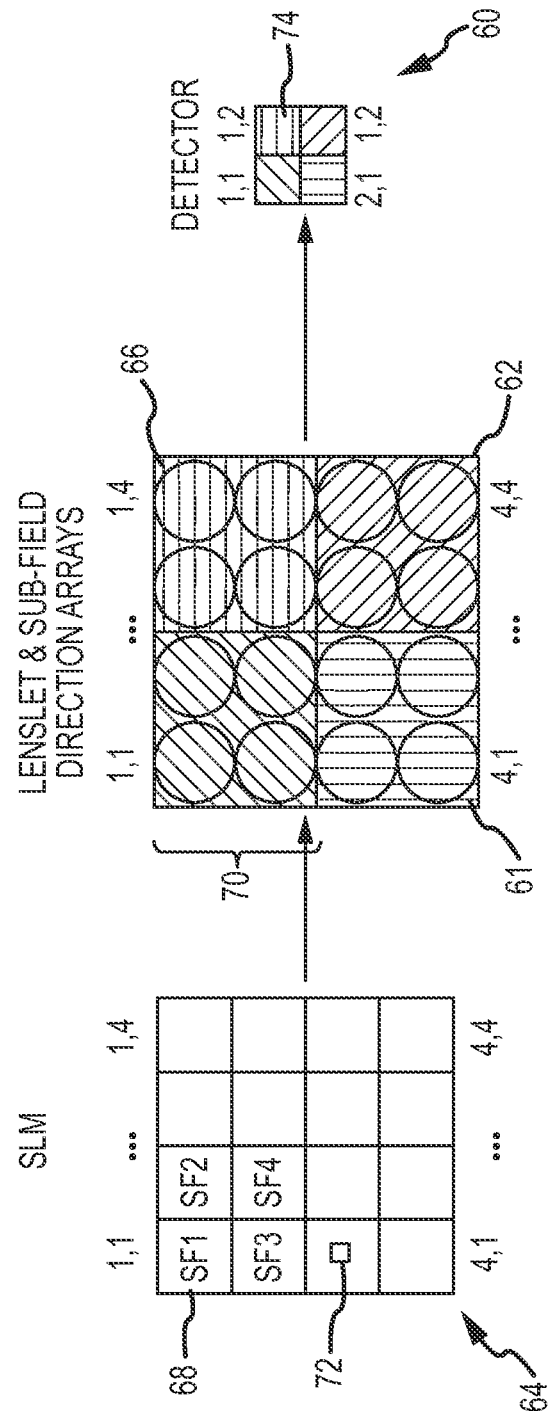

In an acquisition mode as shown in FIGS. 2a and 3a, the SLM addressable elements 72 are configured to pass all of the optical radiation in the FOV to form a 2×2 image on the quad-cell photodiode 60. The processor processes the 2×2 image to detect the object and generate LOS error estimates to locate the object in a sub-region 70 of the FOV. Each detector pixel 74 sees optical radiation from 4×250×250=250,000 independently addressable portions of the FOV for a maximum integration period 76 allowed for the desired guidance update rate 78. This provides maximum sensitivity for detection and acquisition, and provides a LOS error estimate based on the differential responses of the four detector cells.

Figure 2B:
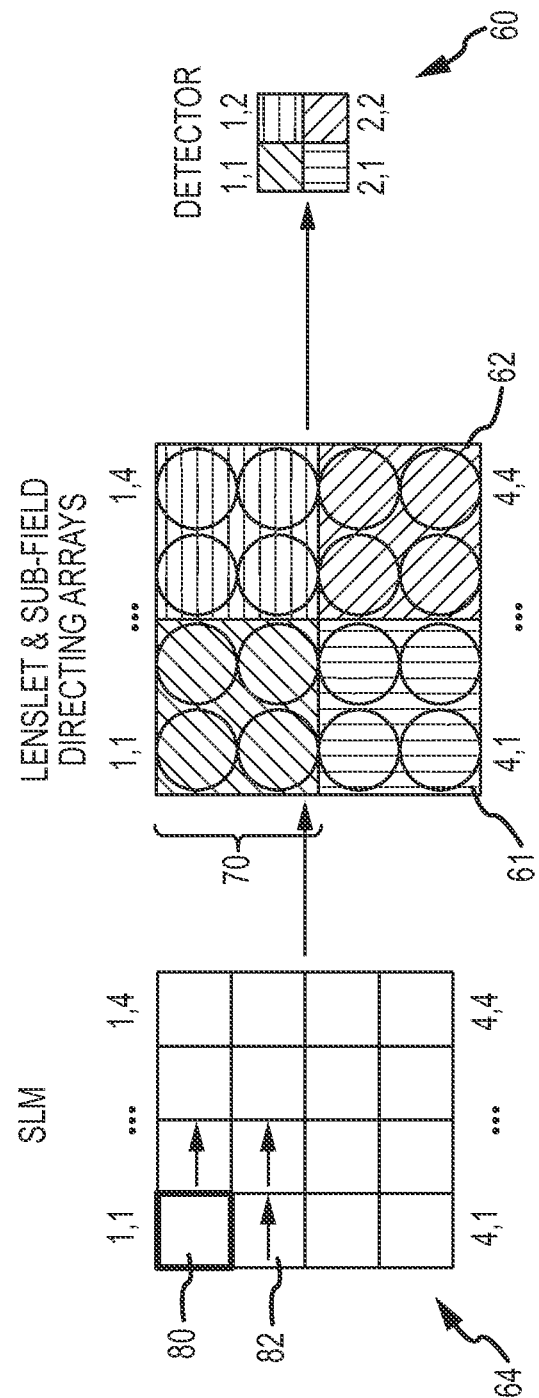

In a first discrimination mode as shown in FIGS. 2b and 3b, the SLM addressable elements 72 are configured to time demultiplex the four sub-fields 68 that map to the upper left sub-region (SR1) 70 by passing all of the optical radiation in a selected sub-field 80 and blocking all of the optical radiation in the other three sub-fields 82. The SLM scans the selected sub-field 80 SF1, SF2, SF3 and SF4 through the sub-region while blocking the other three sub-fields. Each sub-field is selected for an integration period 84 of about one-quarter the maximum integration period to maintain update rate 78. The distance to the object must close to a point that the received signal strength is high enough to reduce the integration period by a factor of four and still achieve the minimum SNR. In this embodiment, the SLM addressable elements 72 are configured to pass all of the optical radiation in the sub-fields that are mapped to the other three sub-regions. The processor reads out the electrical signal from each detector cell at integration period 84. For the detector cell mapped to SR1, the processor generates a different 1-pixel image for each of the 4 sub-fields. The processor may either process each 1 pixel individually to locate the object or may stitch the four 1-pixel images together like a quad-cell readout to locate the object. For the other three detector cells, the processor electronically integrates the 1-pixel images back to the maximum integration period. The processor can process each image to determine if another object is present in one or more of those sub-regions.

In a second discrimination mode as shown in FIGS. 2c and 3c, the SLM addressable elements 72 are configured to time demultiplex portions of the first sub-field (SF1) of the upper-left sub-region (SR1) at the native resolution of the SLM to stitch together a high resolution image of SF1. The SLM is configured to pass optical radiation in SF1 corresponding to a single addressable element 86 and scan that element through SF1. The SLM is configured to block optical radiation in the other three sub-fields in the sub-region. Addressable element 86 is selected for an integration period 88 of $1/62,500$ of the maximum integration period to maintain update rate 78. While, the ratio of $1/62,500$ compared to maximum sensitivity seems like an enormous signal loss, most long-range scenes in missile scenarios are made up of unresolved (point) targets (sub-pixel in the traditional FPA architecture). This means that the dynamic range of sensitivity required in a missile engagement is roughly 40×. In this case a single pixel target acquired at maximum sensitivity can be scanned to a 6×6 or 7×7 image when a terminal aimpoint is required. Again the distance to the object must close to a point that the received signal strength is high enough to main the minimum SNR for object detection and processing to use such a reduced integration period. Note, if the quad-cell photodiode 60 comprises 4×4 detector pixels per cell instead of 1 pixel per cell, the integration period 88 for a native resolution scan is about $1/3,906$ of the maximum integration period. The processor reads out the electrical signal from each detector cell at integration period 88. For the detector cell mapped to SR1, the processor reads out 62,500 1-pixel images and stitches them together electronically to form a 250×250 pixel image of SF1. For the other three detector cells, the processor electronically integrates the 1-pixel images back to the maximum integration period.

Figure 2D:
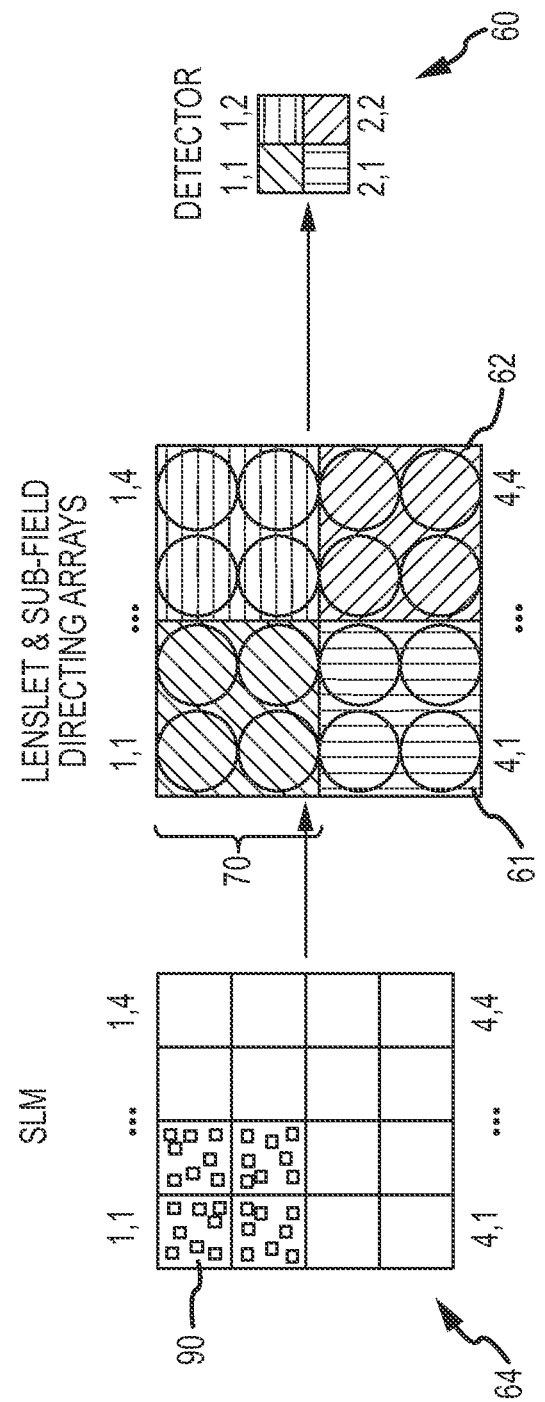

In a third discrimination mode as shown in FIGS. 2d and 3d, the SLM addressable elements 72 are configured to time demultiplex portions of the first sub-field (SF1) of the upper-left sub-region (SR1) at the native resolution of the SLM to stitch together a high resolution image of SF1 by orthogonal coding the optical radiation present in SF1 via selection of the addressable elements. The SLM is configured is configured to pass optical radiation in SF1 corresponding to a subset 90 of the addressable elements 72. The composition of subset 90 changes with each time slice according to the orthogonal code. Due to the sparsity of imagery, orthogonal coding can achieve tremendous compression. Orthogonal coding may be able to produce an image of the sub-field at the native resolution of the SLM in a few time slices compared to the 62,500 time slices required to scan a single addressable element. Consequently, the integration period 92 for each subset 90 can be much longer, allowing for creating of high-resolution images at greater standoff distances. For example, as shown in FIG. 3d assuming sub-field image can be formed from eight subsets via orthogonal coding the integration period 92 is approximately one-eighth of the maximum integration period. The processor reads out the electrical signal from each detector cell at integration period 92. For the detector cell mapped to SR1, the processor reads out 8 1 pixel images and stitches them together electronically by inverting the orthogonally coded image to form a 250×250 pixel image of SF1. For the other three detector cells, the processor electronically integrates the 1-pixel images back to the maximum integration period.

While the Rice single pixel camera could utilize a quad cell detector, it should be noted that without the optical focusing array the physical layout of the system would be prohibitively large for missile applications. In addition, the ability to map multiple sub-fields to a particular sub-region, allows one skilled in the art to optimize the imaging system for the types of scenes the system can be expected to encounter. This allows the system to be tuned to the sparseness of a typical set of scenes, increasing the performance gains from the compressive architecture developed at Rice. In addition, the increased number of sub-fields, provides significant scan speed advantages that mitigate the impact of moving targets on the compressive sensing architecture.

Referring now to FIG. 4, an embodiment of a digitally scanned multi-cell EO sensor 100 having adaptive tilt capability is described. Adaptive tilt provides the EO sensor 100 with additional flexibility to use the full extent and resolution of the low-resolution imaging detector 102 during different modes of operation.

The architecture of the sensor is the same as previously described with two exceptions. First, a field directing optical array 104 is responsive to control signals from a processor(s) 106 to set the optical tilt for each optical focusing element and sub-field to direct the sub-field to a sub-region on imaging detector 102. Second, an optical focusing array 108 is responsive to control signals from processor(s) 106 to set the magnification for each focusing element and sub-field so that the sub-field maps to the extent of the sub-region on imaging detector 102. For example, in a first tilt mode field directing optical array 104 may provide four different tilt angles that direct different sub-fields onto four different sub-regions associated with four separate detector cells. Optical focusing array 108 sets the magnification of each sub-field to map to one-quarter of the full extent of the imaging detector. In a second tilt mode field directing optical array 104 may provide a single tilt angle (e.g. zero tilt) that directs all of the sub-fields to a single sub-region at the center of the detector. Optical focusing array 108 sets the magnification of each sub-field to map to the full extent of the imaging detector.

Objective optics 110 forms an image of an object 112 at an image plane. A SLM 113 at or near the image plane comprises an array of addressable elements to independently and selectively attenuate optical radiation 114 and 116 within different portions of the FOV. Relay optics 118 reimage the optical radiation at another image plane. Optical focusing array 108 is positioned with its focal plane at or near the reimaged plane. The array's optical focusing elements 120 decompose the FOV into multiple sub-fields, four or more, and convert the sub-field spatial mappings at the relayed image plane to an angular mapping. The focusing elements 120 are responsive to control signals from processor(s) 106 to set a magnification for each sub-field. A field correcting optical array 122 insures that the individual optical focusing elements 120 are able to capture as much of the incident optical radiation as possible. Field directing optical array 104 tilts the optical radiation in each sub-field by a tilt angle and is responsive to control signals from processor(s) 106 to set the tilt angle. A focusing optic 124 focuses the optical radiation onto imaging detector 102.

In an embodiment, field directing optical array 104 comprises an adaptive optical phased array. While there are a variety of different technologies that could be employed to create an optical phased array, the typical construct is a liquid crystal device that provides sub-wavelength spatial control of the optical phase, by an electrically induced change in the index of refraction. While the change does not typically have a large dynamic range, beam steering (and thus field of view steering) is possible and through traditional diffractive optic approaches relatively large changes in power are possible [McManamon, P. F., *Optical phased array technology*, Proc. of IEEE, 84 (268-298)].

In an embodiment, optical focusing array 108 comprises a SLM. In an embodiment the SLM can be configured such that the spatial extent of each individual element in the optical focusing array is made of a Fresnel zone plate. The number of Fresnel zones, defined by the radially symmetric binary transmission profile, determines the optical focusing power in each element of the array, allowing dynamic modification of the magnification for a given sub-field. [Fan et al., *Switchable Fresnel lens using polymer-stabilized liquid crystals*, 11 (3080-3086))]. Alternate schemes, might include an optical phased array, deformable mirror, or even a multi-electrode liquid lens to perform this function. It should be clear that there are any number of ways to provide the array of variable optical power required for 108 and it is up to one skilled in the art to determine which technology would operate most effectively for a given application.

Figure 5C:
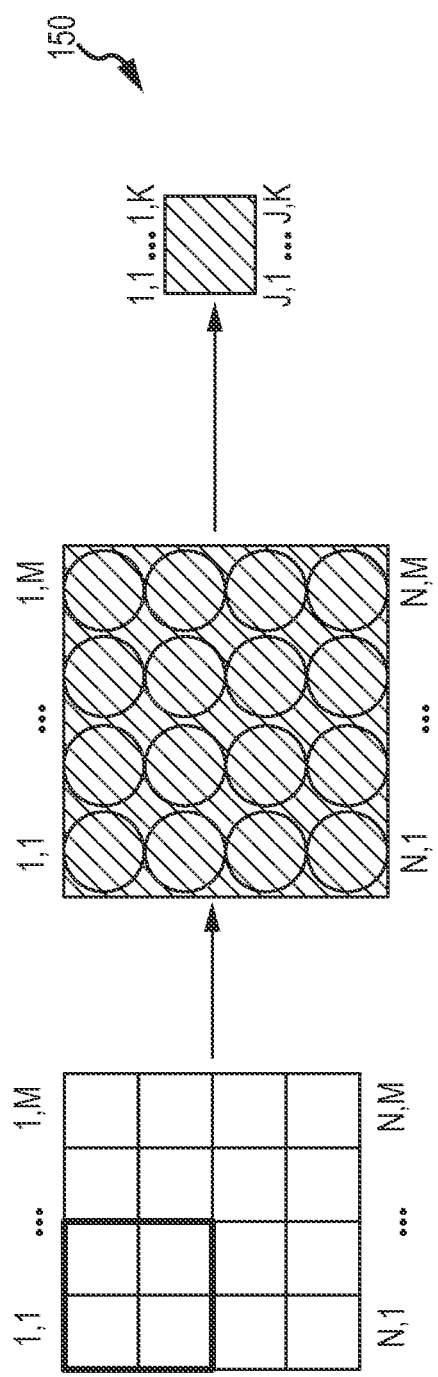

Referring now to FIGS. 5a-5c, a sequence of modes to acquire and track an object using both the descanning capabilities provided by the optical focusing array and SLM and the adaptive tilt capabilities provided by the optical focusing array and field direction array is illustrated. In this example, the imaging detector 150 is a quad-cell detector having one or more pixels per cell. The optical focusing array 152 is a 4×4 array of focusing elements 154 that decompose the FOV into a 4×4 array of sub-fields 156. Each sub-field is mapped to an array of SLM addressable elements. The sub-field directing array 158 can be configured into two states. In a first tilt state, array 158 provides four different tilt angles, one for each 2×2 grouping of focusing elements 154. In a second tilt state, array 158 provides zero tilt for all of the focusing elements. The optical focusing array 152 has a first tilt state in which the magnification is set to map the sub-fields to one-quarter of the imaging detector and second tilt state in which the magnification is set to map the sub-fields to the full extent of the imaging detector.

As shown in FIG. 5a, the SLM is configured to pass all optical radiation in the FOV and the sub-field directing array and optical focusing array are configured in their second tilt states so that all sub-fields are substantially overlapped to the full extent of imaging detector 150. This configuration provides the maximum possible detection sensitivity to detect an object. However, because all of the sub-fields are overlapped onto the imaging detector this configuration provides no LOS error estimate within the FOV. The processor could only detect the existence of an object within the FOV.

As shown in FIG. 5b, the SLM is configured to pass all optical radiation in the FOV and the sub-field directing array 158 and optical focusing array 152 are configured in their first tilt state so that the 2×2 groupings of sub-fields are mapped and overlapped onto different quadrants of imaging detector

150. This configuration provides less detection sensitivity although still high. However, now the configuration functions very similar to a standard quad-cell and can produce a LOS error estimate to the object within the FOV. The processor can now confirm the existence of the object and provide a LOS error estimate to a guidance system.

As shown in FIG. 5*c*, the SLM is configured to pass all optical radiation in the top left quadrant of FOV and block all optical radiation in rest of the FOV and the sub-field directing array and optical focusing array are configured in their second tilt states so that all sub-fields are substantially overlapped to the full extent of imaging detector 150. This configuration provides the maximum possible detection sensitivity and resolution to detect an object in the upper left quadrant of the FOV. The processor can confirm the existence of the object in the upper left quadrant, provide LOS error estimates and may start to resolve the object itself. The processor can also use the SLM to descan the sub-fields to further resolve the object. However, in this configuration the sensor cannot see three-quarters of the FOV.

While several illustrative embodiments of the invention have been shown and described, numerous variations and alternate embodiments will occur to those skilled in the art. Such variations and alternate embodiments are contemplated, and can be made without departing from the spirit and scope of the invention as defined in the appended claims.

We claim:

1. An electro-optic (EO) sensor, comprising:
   an objective optical system that forms an image within a field of view at an image plane;
   a spatial light modulator (SLM) positioned at or near the image plane, said spatial light modulator comprising an array of addressable elements to independently and selectively attenuate optical radiation within different portions of the field of view;
   an optical focusing array comprising at least four optical focusing elements that decompose the field of view into at least four sub-fields, each said sub-field corresponding to a plurality of SLM addressable elements;
   a sub-field directing array that tilts the selected optical radiation in each said sub-field by a tilt angle, in a first tilt mode said sub-field directing array configured to provide at least four different tilt angles;
   a focusing optic that focuses the optical radiation at a common image plane that is a relayed version of the image plane, in said first tilt mode said focusing optic directing the tilted optical radiation to form at least four spatially separated sub-regions at the common image plane, each said sub-region corresponding to one or more sub-fields; and
   a multi-cell imaging detector positioned at or near the common image plane, each said cell comprising at least one pixel element that converts incident optical radiation into an electrical signal, in said first tilt mode each said sub-region being mapped to a different detector cell,
   wherein the SLM digitally scans the FOV to select different portions of the FOV to map onto the different detector cells.

2. The EO sensor of claim 1, wherein the imaging detector is responsive to optical radiation in one of the SWIR, MIR and LWIR spectral bands.

3. The EO sensor of claim 1, wherein said imaging detector comprises a quad-cell photodiode, each said cell comprising a single pixel element, in said first tilt mode said sub-field directing array configured to provide four different tilt angles to map a different said sub-region to each of the four cells of the quad-cell photodiode.

4. The EO sensor of claim 1, wherein said at least four different tilt angles are fixed.

5. The EO sensor of claim 1, wherein the number of optical focusing elements is greater than the number of sub-regions, in said first tilt mode said sub-field directing array provides tilt angles so that the focusing element directs non-blocked optical radiation from multiple sub-fields to substantially overlap in each said sub-region at the common image plane, each said sub-field mapped to only one said sub-region.

6. The EO sensor of claim 5, further comprising:
   a processor configured to generate control signals for the addressable elements corresponding to the one or more sub-regions to pass optical radiation for a different one of said multiple sub-fields in a time sequence to time demultiplex the spatially overlapping sub-fields in at least one said sub-region, each said detector pixel in the sub-region detecting only the optical radiation from the one selected sub-field at a given time.

7. The EO sensor of claim 1, wherein said sub-field directing array is reconfigurable to provide different tilt angles and said optical focusing array is reconfigurable to provide different optical magnification for each sub-field, further comprising:
   a processor configured to provide control signals to set the tilt angle and to set the optical magnification so that the combined sub-regions are mapped to the full extent of the imaging detector.

8. The EO sensor of claim 7, wherein in a second tilt mode the sub-field directing array is configured to select approximately the same tilt angle for all of the sub-fields and the optical focusing array is configured to set a magnification so that each said sub-region is mapped to the full extent of the imaging detector.

9. An electro-optic (EO) sensor comprising:
   an objective optical system that forms an image within a field of view;
   a spatial light modulator (SLM) comprising an array of addressable elements to independently and selectively attenuate optical radiation within different portions of the field of view;
   an optical focusing array comprising at least four optical focusing elements that decompose the field of view into at least four sub-fields, each said sub-field corresponding to a plurality of SLM addressable elements;
   a sub-field directing array that tilts the selected optical radiation in each said sub-field by a tilt angle, in a first tilt mode said sub-field directing array configured to provide at least four different tilt angles;
   a focusing optic that focuses the optical radiation at a common image plane, in said first tilt mode said focusing optic directing the tilted optical radiation to form at least four spatially separated sub-regions at the common image plane, each said sub-region corresponding to one or more sub-fields;
   a multi-cell imaging detector positioned at or near the common image plane, each said cell comprising at least one pixel element that converts incident optical radiation into an electrical signal, in said first tilt mode each said sub-region being mapped to a different detector cell; and
   a processor configured to execute an acquisition mode and a discrimination mode,
      in said acquisition mode, said processor is configured to generate control signals for the addressable elements to pass all of the optical radiation to form an image of the object over the entire field of view on the entire imaging detector, and in said discrimination mode, said processor is configured to generate control signals for the addressable elements corresponding to a sub-region to pass optical radiation for one or more different portions of a sub-field in a time sequence to time demultiplex the spatially overlapping portions of the sub-field to form an image of that sub-field of the object on the area of the imaging detector corresponding to the sub-region.

10. The EO sensor of claim 9, wherein in said first tilt mode said processor is configured to generate the control signals for the addressable elements corresponding to at least two of the sub-regions to concurrently time demultiplex the spatially overlapping portions of at least two different sub-fields in at least two different sub-regions.

11. An electro-optic (EO) sensor comprising:
an objective optical system that forms an image within a field of view;
a spatial light modulator (SLM) comprising an array of addressable elements to independently and selectively attenuate optical radiation within different portions of the field of view;
an optical focusing array comprising at least four optical focusing elements that decompose the field of view into at least four sub-fields, each said sub-field corresponding to a plurality of SLM addressable elements;
a sub-field directing array that tilts the selected optical radiation in each said sub-field by a tilt angle, in a first tilt mode said sub-field directing array configured to provide at least four different tilt angles;
a focusing optic that focuses the optical radiation at a common image plane, in said first tilt mode said focusing optic directing the tilted optical radiation to form at least four spatially separated sub-regions at the common image plane, each said sub-region corresponding to one or more sub-fields;
a multi-cell imaging detector positioned at or near the common image plane, each said cell comprising at least one pixel element that converts incident optical radiation into an electrical signal, in said first tilt mode each said sub-region being mapped to a different detector cell; and
a processor configured to generate control signals for the addressable elements to time demultiplex spatially overlapping portions of the FOV on the imaging detector, read out each time demultiplexed image from the imaging detector at an integration period and form an image, said processor configured to calculate a signal-to-noise ratio (SNR) of the image and to set a minimum integration period to maintain a desired SNR.

12. A method of electro-optic sensing, comprising:
forming an image at a first image plane from optical radiation of an object within a field of view;
at or near the first image plane, using a spatial light modulator (SLM) having an array of addressable elements to independently and selectively attenuate optical radiation within different portions of said field of view;
focusing the optical radiation with a plurality of optical focusing elements that map the field of view into at least four sub-fields;
optically magnifying the optical radiation from each said sub-field by a magnification level;
optically tilting the optical radiation from each said sub-field by a tilt angle, in a first tilt mode tilting the optical radiation by at least four different tilt angles across the field of view;
focusing the optical radiation to a common image plane, in said first tilt mode directing the tilted optical radiation to form at least four spatially separated sub-regions at the common image plane, each said sub-region corresponding to one or more sub-fields;
at or near the common image plane, detecting incident optical radiation with an imaging detector comprising pixel elements that convert the incident optical radiation into an electrical signal, each said detector pixel element being mapped to a plurality of SLM addressable elements;
setting the magnification levels so that the combined sub-regions map to the full extent of the imaging detector; and
controlling the SLM to digitally scan the FOV to select different portions of the FOV to map onto the different detector cells.

13. The method of claim 12, wherein said imaging detector comprises a quad-cell detector, each said cell comprising a single pixel element, in said first tilt mode said optical radiation tilted by four different tilt angles to map a different said sub-region to each of the four cells of the quad-cell detector.

14. The method of claim 12, further comprising:
addressing different sub-regions of the SLM to concurrently time demultiplex different portions of the FOV and form sub-images on different cells of the imaging detector; and
for each said different cell, stitching together the sub-images to form an image of a portion of the FOV at a resolution.

15. The method of claim 12, further comprising:
calculating a signal-to-noise ratio (SNR) of the image;
setting a minimum integration period to maintain the SNR;
addressing the SLM to time demultiplex spatially overlapping portions of the FOV on the imaging detector; and
reading out each time demultiplexed image from the imaging detector at an integration period of at least said minimum integration period.

16. The method of claim 12, further comprising in said first tilt mode,
in an acquisition mode, controlling the addressable elements to pass all of the optical radiation to form an image of the object over the entire field of view on the entire imaging detector, and
in a discrimination mode, controlling the addressable elements corresponding to a sub-region to pass optical radiation for one or more different portions of a sub-field in a time sequence to time demultiplex the spatially overlapping portions of the sub-field to form an image of that sub-field of the object on the area of the imaging detector corresponding to the sub-region.

17. The method of claim 12, further comprising:
in a second tilt mode,
tilting the optical radiation by approximately the same tilt angle across all of the sub-fields to form a single sub-region; and
setting the magnification level so that said single sub-region is mapped to the full extent of the imaging detector.

18. The method of claim 12, further comprising:
in said first tilt mode and an acquisition mode, controlling the addressable elements to pass all of the optical radiation to form an image of the object over the entire field in the at least four sub-regions on the full extent of the imaging detector, and
in second tilt mode and a discrimination mode
tilting the optical radiation by a controlled angle across all of the sub-fields to form a single sub-region and setting the magnification level so that said single sub-region is mapped to the full extent of the imaging detector; and controlling the addressable elements corresponding to a particular sub-field to substantially pass optical radiation for one or more different portions of the sub-field in a time sequence to time de-multiplex the spatially overlapping portions of the sub-field to form an image of that sub-field of the object on the full extent of the imaging detector and to substantially block the optical radiation for all other sub-fields.

* * * * *